United States Patent
Jo et al.

(10) Patent No.: US 12,193,331 B2
(45) Date of Patent: Jan. 7, 2025

(54) THERMOELECTRIC MODULE

(71) Applicant: LG INNOTEK CO., LTD., Seoul (KR)

(72) Inventors: Min Sung Jo, Seoul (KR); Sue Kyung Oh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/213,314

(22) Filed: Jun. 23, 2023

(65) Prior Publication Data

US 2023/0337540 A1      Oct. 19, 2023

Related U.S. Application Data

(63) Continuation of application No. 16/963,663, filed as application No. PCT/KR2019/000894 on Jan. 22, 2019, now Pat. No. 11,730,056.

(30) Foreign Application Priority Data

Jan. 23, 2018   (KR) .................. 10-2019-0008421
Feb. 5, 2018    (KR) .................. 10-2018-0014198

(51) Int. Cl.
  *H10N 10/17*    (2023.01)
  *H10N 10/80*    (2023.01)
  *H10N 10/852*   (2023.01)

(52) U.S. Cl.
  CPC ............. *H10N 10/17* (2023.02); *H10N 10/80* (2023.02); *H10N 10/852* (2023.02)

(58) Field of Classification Search
  CPC ........ H10N 10/81; H10N 10/80; H10N 10/17; H01L 35/02; H01L 35/04
  See application file for complete search history.

(56) References Cited

U.S. PATENT DOCUMENTS 6,347,521 B1 *   2/2002   Kadotani ................ H01L 23/38
                                                          136/204
2006/0042675 A1  3/2006   Tateyama et al.
(Continued)

FOREIGN PATENT DOCUMENTS

EP    2869354    5/2015
EP    2894682    7/2015
(Continued)

OTHER PUBLICATIONS

English machine translation of Horio (JP 2009188088) published Aug. 2009.*

(Continued)

*Primary Examiner* — Christina Chern
(74) *Attorney, Agent, or Firm* — KED & ASSOCIATES, LLP

(57) ABSTRACT

A thermoelectric module may comprise: a first metal support; a first heat conductive layer; a second heat conductive layer and formed from a resin composition; a plurality of first electrodes arranged on the second heat conductive layer; a plurality of P-type thermoelectric legs and a plurality of N-type thermoelectric legs alternately arranged on the plurality of first electrodes; a plurality of second electrodes arranged on the plurality of P-type thermoelectric legs and the plurality of N-type thermoelectric legs; a third heat conductive layer arranged on the plurality of second electrodes, and made from the same resin composition as the resin composition that forms the first heat conductive layer; and a second metal support arranged on the third heat conductive layer, wherein the second heat conductive layer is arranged to encompass an upper surface of the first heat conductive layer and a side surface of the first heat conductive layer.

6 Claims, 9 Drawing Sheets

(56) References Cited

U.S. PATENT DOCUMENTS

| | | |
|---|---|---|
| 2011/0256653 A1 | 10/2011 | Garcia Ramos |
| 2012/0160293 A1 | 6/2012 | Jinushi |
| 2013/0014516 A1 | 1/2013 | Yang et al. |
| 2013/0081663 A1 | 4/2013 | Yang |
| 2014/0230875 A1 | 8/2014 | Angermann |
| 2015/0179912 A1 | 6/2015 | Maeshima et al. |
| 2015/0194589 A1 | 7/2015 | Roh |
| 2016/0181500 A1 | 6/2016 | Lin |
| 2019/0051807 A1 | 2/2019 | Okumura et al. |

FOREIGN PATENT DOCUMENTS

| | | | |
|---|---|---|---|
| EP | 3379588 | | 9/2018 |
| JP | 2000-214934 | | 8/2000 |
| JP | 2003-046147 | A | 2/2003 |
| JP | 2004-311819 | | 11/2004 |
| JP | 2006-073632 | | 3/2006 |
| JP | 2006-269572 | | 10/2006 |
| JP | 2007-035974 | | 2/2007 |
| JP | 2008-066374 | | 3/2008 |
| JP | 2008-124067 | | 5/2008 |
| JP | 2009-105305 | | 5/2009 |
| JP | 2009188088 | A * | 8/2009 ............. H01L 35/30 |
| JP | 2017-098282 | | 6/2017 |
| KR | 20-0206613 | | 12/2000 |
| KR | 10-2009-0120437 | | 11/2009 |
| KR | 10-2015-0082914 | | 7/2015 |
| KR | 10-2016-0126803 | | 11/2016 |
| KR | 10-2017-0065315 | | 6/2017 |
| KR | 10-2017-0127994 | | 11/2017 |
| WO | WO 2014/199541 | | 12/2014 |

OTHER PUBLICATIONS

International Search Report dated Apr. 26, 2019 issued in Application No. PCT/KR2019/000894.

European Search Report dated Oct. 12, 2021 issued in Application No. 19743874.0.

Korean Office Action dated Nov. 15, 2021 issued in Application No. 10-2018-0014198.

U.S. Office Action dated Mar. 7, 2022 issued in parent U.S. Appl. No. 16/963,663.

U.S. Office Action dated Jun. 24, 2022 issued in parent U.S. Appl. No. 16/963,663.

Japanese Office Action dated Oct. 29, 2024, issued in Application No. 2023-213561.

* cited by examiner

THERMOELECTRIC MODULE

CROSS-REFERENCE TO RELATED APPLICATIONS

This application is a Continuation Application of prior U.S. patent application Ser. No. 16/963,663 filed Jul. 21, 2020, which is a U.S. National Stage Application under 35 U.S.C. § 371 of PCT Application No. PCT/KR2019/000894, filed Jan. 22, 2019, which claims priority to Korean Patent Application Nos. 10-2018-0008421, filed Jan. 23, 2018 and 10-2018-0014198, filed Feb. 5, 2018, whose entire disclosures are hereby incorporated by reference.

BACKGROUND

1. Field

The present invention relates to a thermoelectric module, and more particularly, to a substrate and an electrode structure of a thermoelectric element.

2. Background

A thermoelectric effect is a phenomenon caused due to movements of electrons and holes in a material and means direct energy conversion between heat and electricity.

A thermoelectric element is a generic term for a device which uses a thermoelectric effect and has a structure in which a P-type thermoelectric material and an N-type thermoelectric material are disposed between metal electrodes and bonded to form a pair of PN junctions.

The thermoelectric element may be classified as an element using a temperature variation in electrical resistance, an element using the Seebeck effect in which an electromotive force is generated due to a temperature difference, an element using the Peltier effect which is a phenomenon in which heat absorption or heat radiation occurs due to a current and the like.

Thermoelectric elements are widely applied to household appliances, electronic parts, and communication parts. For example, the thermoelectric elements may be applied to cooling devices, heating devices, power generation devices, and the like. Accordingly, the demand for thermoelectric performance of the thermoelectric elements is gradually increasing.

The thermoelectric element includes substrates, electrodes, and thermoelectric legs. A plurality of thermoelectric legs are disposed in the form of an array between an upper substrate and a lower substrate. A plurality of upper electrodes are disposed between the plurality of thermoelectric legs and the upper substrate, and a plurality of lower electrodes are disposed between the plurality of thermoelectric legs and the lower substrate. Here, the plurality of upper electrodes and the plurality of lower electrodes connect the thermoelectric legs in series or in parallel.

Generally, each of the upper substrate and the lower substrate may be an aluminum oxide (Al2O3) substrate. Owing to a flatness problem, the Al2O3 substrate should maintain a thickness of a predetermined level or higher. Thus, there is a problem in that a total thickness of the thermoelectric element becomes larger.

Meanwhile, when the thermoelectric elements are used for cooling, the thermoelectric elements can be applied to refrigerators or water purifiers, but there is a problem in that the thermoelectric elements are corroded by condensation and moisture due to low temperature implementation. In order to solve the above problem, in the related art, a sealing material is directly disposed on a side surface of a thermoelectric element to prevent moisture infiltration. However, since the sealing material is directly bonded to the thermoelectric element, there is a problem in that heat flow performance is degraded in a thermoelectric module.

BRIEF DESCRIPTION OF THE DRAWINGS

The embodiments will be described in detail with reference to the following drawings in which like reference numerals refer to like elements wherein.

DETAILED DESCRIPTION

Figure 1:
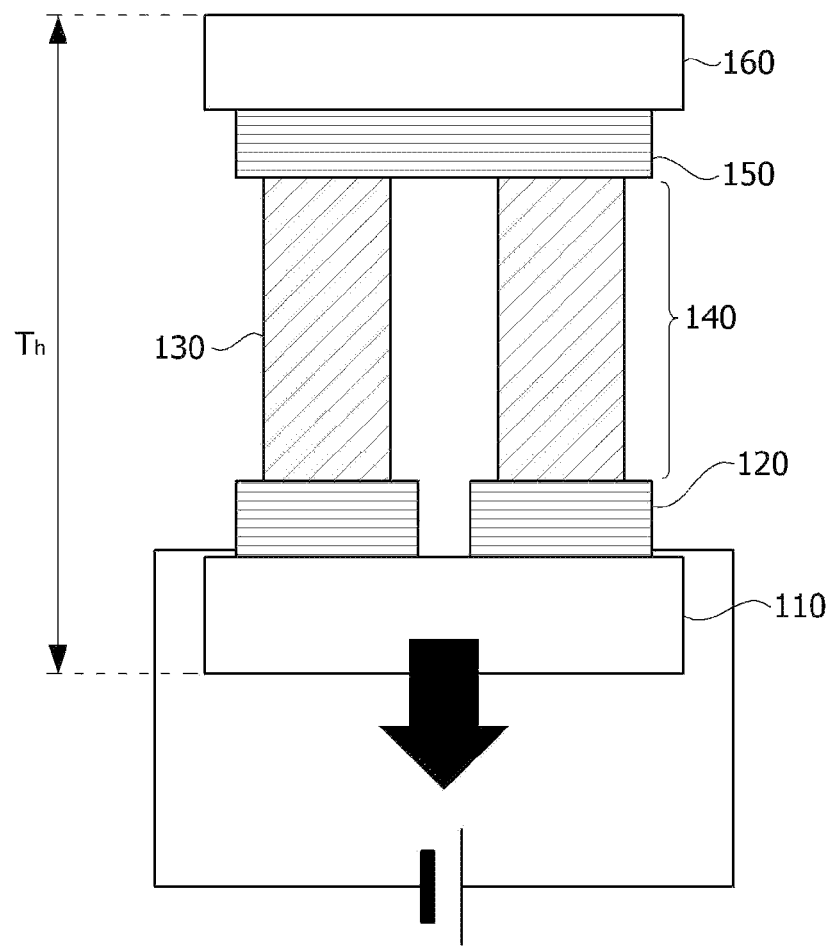
FIG. 1 is a cross-sectional view illustrating a thermoelectric element.

The present invention may be modified into various forms and may have a variety of embodiments, and, therefore, specific embodiments will be illustrated in the accompanying drawings and described. The embodiments, however, are not to be taken in a sense which limits the present invention to the specific embodiments and should be construed to include modifications, equivalents, or substituents within the spirit and technical scope of the present invention.

Also, terms including ordinal numbers such as first, second, and the like used herein may be used to describe various components, but the various components are not limited by these terms. The terms are used only for the purpose of distinguishing one component from another component. For example, without departing from the scope of the present invention, a second component may be referred to as a first component, and similarly, a first component may also be referred to as a second component. The term "and/or" includes a combination of a plurality of related listed items or any one item of the plurality of related listed items.

When a component is referred to as being "connected" or "coupled" to another component, it may be directly connected or coupled to another component, but it should be understood that still another component may be present between the component and another component. On the contrary, when a component is referred to as being "directly connected" or "directly coupled" to another, it should be understood that still another component may not be present between the component and another component.

The terms used herein are employed to describe only specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof but do not preclude the presence or possibility of adding one or more other features, numbers, steps, operations, components, elements, or combinations thereof.

Unless otherwise defined, all terms including technical or scientific terms used herein have the same meaning as commonly understood by those skilled in the art to which the present invention pertains. General terms that are defined in a dictionary should be construed as having meanings that are consistent in the context of the relevant art and are not to be interpreted as having an idealistic or excessively formalistic meaning unless clearly defined in the present application.

Hereinafter, embodiments of the present invention will be described in detail with reference to the accompanying drawings, the same reference numerals are given to the same or corresponding components regardless of a number of the drawing, and a duplicate description thereof will be omitted.

Figure 2:
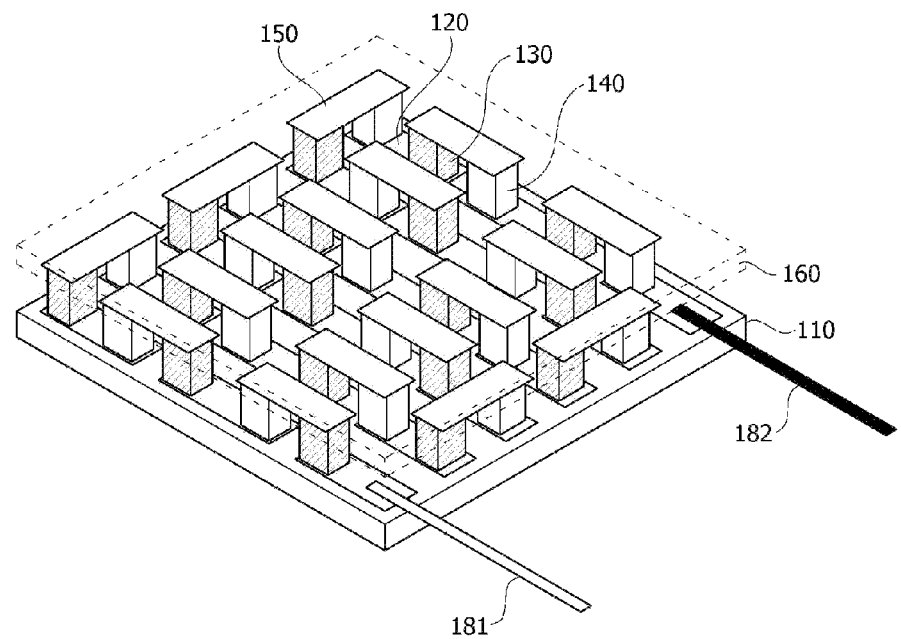
FIG. 2 is a perspective view illustrating the thermoelectric element.

FIG. 1 is a cross-sectional view illustrating a thermoelectric element, and FIG. 2 is a perspective view illustrating the thermoelectric element.

Referring to FIGS. 1 and 2, a thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and bottom surfaces of the P-type thermoelectric leg 130 and the N-type thermoelectric leg 140, and the upper electrode 150 is disposed between the upper substrate 160 and top surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrode 120 and the upper electrode 150. The pair of P-type thermoelectric leg 130 and N-type thermoelectric leg 140, which are disposed between the lower electrode 120 and the upper electrode 150 and electrically connected to each other, may form a unit cell.

For example, when voltages are applied to the lower electrode 120 and the upper electrode 150 through lead lines 181 and 182, a substrate in which a current flows from the P-type thermoelectric leg 130 to the N-type thermoelectric leg 140 due to the Peltier effect may absorb heat to serve as a heat absorption part, and a substrate in which a current flows from the N-type thermoelectric leg 140 to the P-type thermoelectric leg 130 may be heated to serve as a heat radiation part.

Here, each of the P-type thermoelectric leg 130 and the N-type thermoelectric leg 140 may be a bismuth telluride (Bi—Te)-based thermoelectric leg containing Bi and transverse electric (TE) as main raw materials. The P-type thermoelectric leg 130 at 100 wt % may be a thermoelectric leg which includes 99 to 99.999 wt % Bi—Te-based main low material containing at least one among antimony (Sb), nickel (Ni), Al, Cu, silver (Ag), lead (Pb), boron (B), gallium (Ga), Te, Bi, and indium (In) and includes 0.001 to 1 wt % mixture containing Bi or Te. For example, the P-type thermoelectric leg 120 at 100 wt % may include Bi—Se—Te as the main raw material and may further include 0.001 to 1 wt % Bi or Te. The N-type thermoelectric leg 140 may be a thermoelectric leg which includes 99 to 99.999 wt % Bi—Te-based low material containing at least one among selenium (Se), nickel (Ni), aluminum (Al), copper (Cu), silver (Ag), lead (Pb), boron (B), gallium (Ga), Te, Bi, and indium (In) and includes 0.001 to 1 wt % mixture containing Bi or Te based on 100 wt %. For example, the N-type thermoelectric leg 130 at 100 wt % may include Bi—Sb—Te as the main raw material and may further include 0.001 to 1 wt % Bi or Te.

Each of the P-type thermoelectric leg 130 and the N-type thermoelectric leg 140 may be formed in a bulk shape or a stacked shape. Generally, a bulk-shaped P-type thermoelectric leg 130 or a bulk-shaped N-type thermoelectric leg 140 may be obtained by heat-treating a thermoelectric material to produce an ingot, crushing and sieving the ingot to obtain a thermoelectric leg powder, sintering the thermoelectric leg powder, and cutting the sintered body. A stack-shaped P-type thermoelectric leg 130 or a stack-shaped N-type thermoelectric leg 140 may be obtained by applying a paste containing a thermoelectric material on a sheet-shaped substrate to form a unit member, stacking unit members, and cutting the stacked unit members.

In this case, the pair of P-type thermoelectric leg 130 and N-type thermoelectric leg 140 may have the same shape and volume or may have different shapes and volumes. For example, since electrical conductivity characteristics of the P-type thermoelectric leg 130 and the N-type thermoelectric leg 140 are different, a height or a cross-sectional area of the N-type thermoelectric leg 140 may be formed differently from that of the P-type thermoelectric leg 130.

Performance of a thermoelectric element according to one embodiment of the present invention may be expressed by a thermoelectric figure of merit ZT. The thermoelectric figure of merit ZT may be expressed by Equation 1.

$$ZT = \alpha^2 \cdot \sigma \cdot T / k \qquad \text{[Equation 1]}$$

Here, $\alpha$ is a Seebeck coefficient (V/K), $\sigma$ is electrical conductivity (S/m), and $\alpha 2\sigma$ is a power factor (W/mK2). Further, T is a temperature, and k is thermal conductivity (W/mK). k may be expressed as $a \cdot cp \cdot \rho$, a is thermal diffusivity (cm2/S), cp is a specific heat (J/gK), and $\rho$ is density (g/cm3).

In order to obtain a thermoelectric figure of merit ZT of the thermoelectric element, a Z value (V/K) is measured using a Z-meter, and the thermoelectric figure of merit ZT may be calculated using the measured Z value.

Here, the lower electrode 120 disposed between the lower substrate 110, the P-type thermoelectric leg 130, and the N-type thermoelectric leg 140, and the upper electrode 150 disposed between the upper substrate 160, the P-type thermoelectric leg 130, and the N-type thermoelectric leg 140 may each include at least one among Cu, Ag, and Ni.

In addition, sizes of the lower substrate 110 and the upper substrate 160 may be formed to be different from each other. For example, a volume, a thickness, or an area of one of the lower substrate 110 and the upper substrate 160 may be formed to be larger than that of the other one thereof. Consequently, heat absorption performance or heat radiation performance of the thermoelectric element may be improved. For example, a width of the lower substrate 110 may be formed to be larger than that of the upper substrate 160. Consequently, lead lines 181 and 182 may be easily connected to a lower electrode disposed at a distal end of the lower substrate 110.

In addition, a heat dissipation pattern, e.g., an irregular pattern, may be formed on at least one surface of the lower substrate 110 and the upper substrate 160. Consequently, the heat dissipation performance of the thermoelectric element may be improved. When the irregular pattern is formed on a surface in contact with the P-type thermoelectric leg 130 or the N-type thermoelectric leg 140, a bonding characteristic between the thermoelectric leg and the substrate may also be improved.

In this case, the P-type thermoelectric leg 130 or the N-type thermoelectric leg 140 may have a cylindrical shape, a polygonal column shape, an elliptical column shape, or the like.

Alternatively, the P-type thermoelectric leg 130 or the N-type thermoelectric leg 140 may have a stacked structure. For example, the P-type thermoelectric leg or the N-type thermoelectric leg may be formed by a method of stacking a plurality of structures, in which a semiconductor material is applied on a sheet-shaped base substrate, and then cutting the plurality of structures. Thus, it is possible to prevent a loss of material and improve an electrical conduction characteristic.

Alternatively, the P-type thermoelectric leg 130 or the N-type thermoelectric leg 140 may be formed according to a zone melting method or a powder sintering method. According to the zone melting method, a thermoelectric leg is obtained by a method of forming an ingot using a thermoelectric material, slowly heating the ingot, refining particles of the ingot to be rearranged in a single direction, and then slowly cooling the ingot. According to the powder sintering method, a thermoelectric leg is obtained through a process of forming an ingot using a thermoelectric material, crushing and sieving the ingot to obtain a powder for a thermoelectric leg, and sintering the powder.

Figure 3:
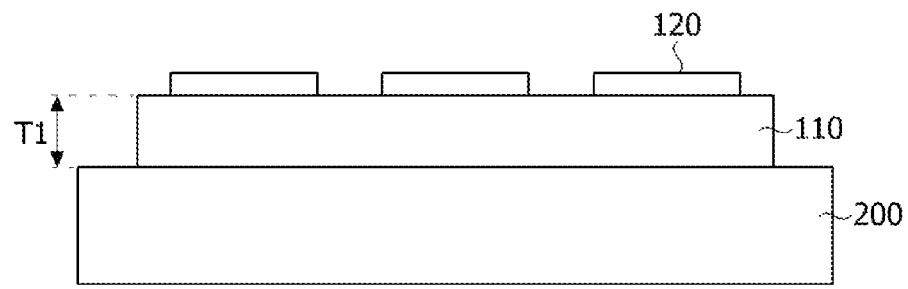
FIG. 3 is a cross-sectional view illustrating an example of a lower substrate of a thermoelectric module.
Figure 4:
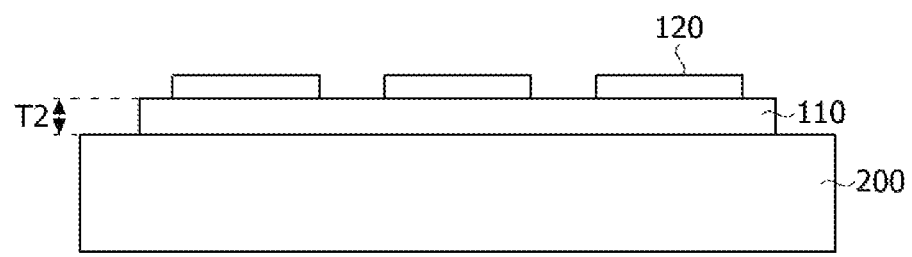
FIG. 4 is a cross-sectional view illustrating another example of the lower substrate of the thermoelectric module.

FIG. 3 is a cross-sectional view illustrating an example of a lower substrate of a thermoelectric module, and FIG. 4 is a cross-sectional view illustrating another example of the lower substrate of the thermoelectric module.

Referring to FIGS. 3 to 4, the thermoelectric element 100 may be disposed on a metal support 200. The lower substrate 110 of the thermoelectric element 100 may be disposed on the metal support 200, and a plurality of lower electrodes 120 may be disposed on the lower substrate 110.

Structures of a P-type thermoelectric leg, an N-type thermoelectric leg, an upper electrode, and an upper substrate are the same as those described with reference to FIGS. 1 to 2, and thus duplicated descriptions thereof will be omitted herein.

Referring to FIG. 3, the lower substrate 110 may be an Al2O3 substrate. In this case, due to a flatness problem of the Al2O3 substrate, a thickness T1 of the lower substrate 110 cannot be fabricated to be less than or equal to 0.65 mm. When the thickness of the lower substrate 110 becomes larger, a thickness of the lower electrode 120 should become larger together with the thickness of the lower substrate 110. Consequently, there is a problem in that an overall thickness of the thermoelectric element 100 should become larger.

Referring to FIG. 4, the lower substrate 110 may be a heat conductive layer made of a resin composition containing an epoxy resin and an inorganic filler. In this case, since the heat conductive layer does not have a flatness problem, it is possible to fabricate the heat conductive layer to have a thickness T2 that is smaller than that of the Al2O3 substrate, for example, a thickness that is less than or equal to 0.65 mm. In a structure shown in FIG. 4, the lower electrode 120 may be fabricated by a method of arranging a copper (Cu) substrate on a heat conductive layer made of a resin composition containing an epoxy resin and an inorganic filler, compressing the Cu substrate, and then etching the Cu substrate in an electrode shape. However, when the thickness of the lower substrate 110 becomes less than or equal to 0.65 mm, the lower substrate 110 becomes vulnerable to a variation in temperature. Thus, there is a problem in that delamination occurs between the lower substrate 110 and the metal support 200 so that reliability of the thermoelectric element 100 is degraded. In this specification, the metal support 200 may be interchangeably used with a heat conductive plate.

Figure 5:
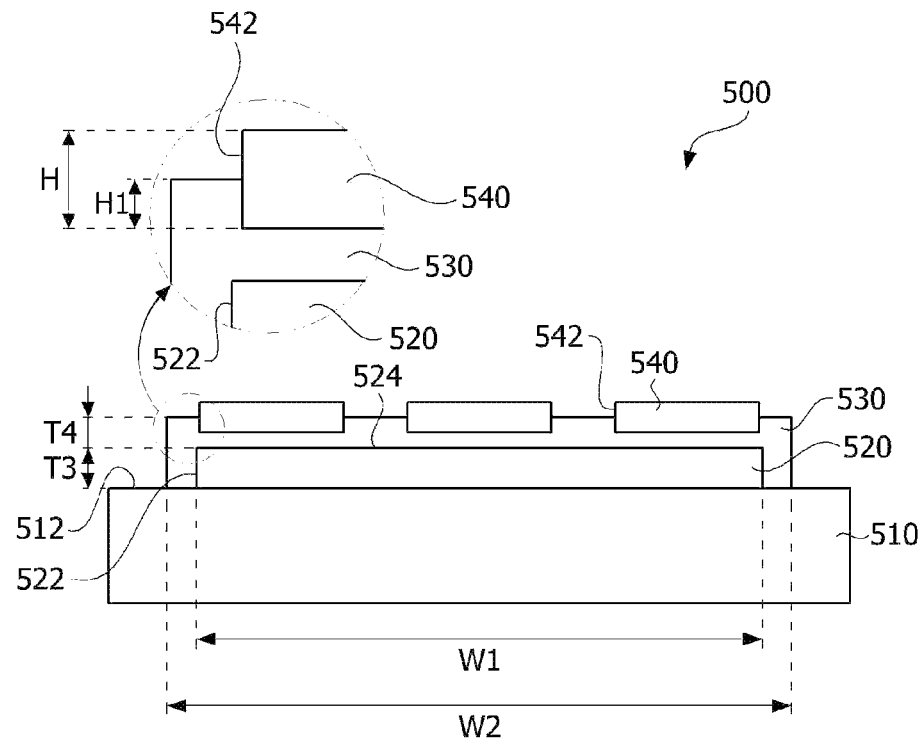
FIG. 5 is a cross-sectional view illustrating a lower substrate of a thermoelectric module according to one embodiment of the present invention.
Figure 6:
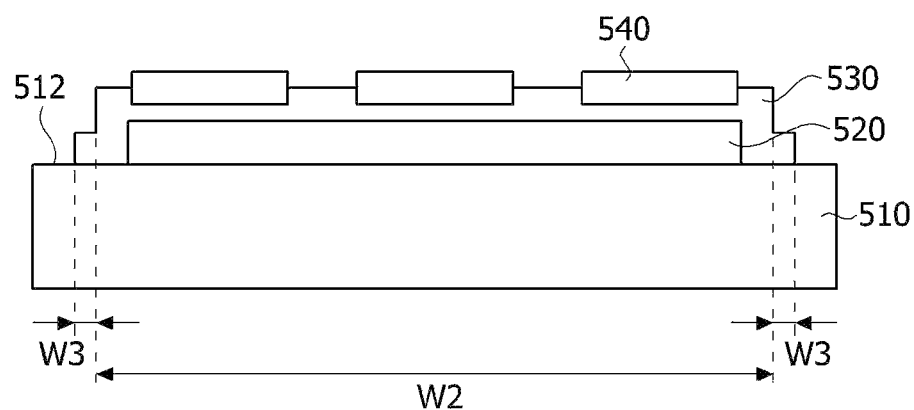
FIG. 6 is a cross-sectional view illustrating a lower substrate of a thermoelectric module according to another embodiment of the present invention.
Figure 7:
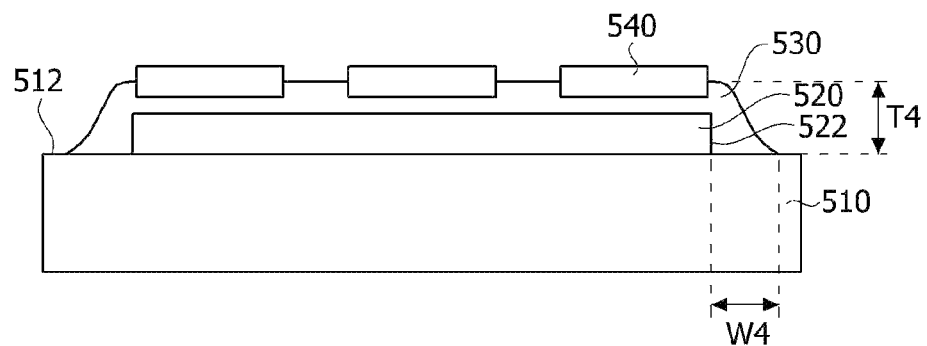
FIG. 7 is a cross-sectional view illustrating a lower substrate of a thermoelectric module according to still another embodiment of the present invention.
Figure 8:
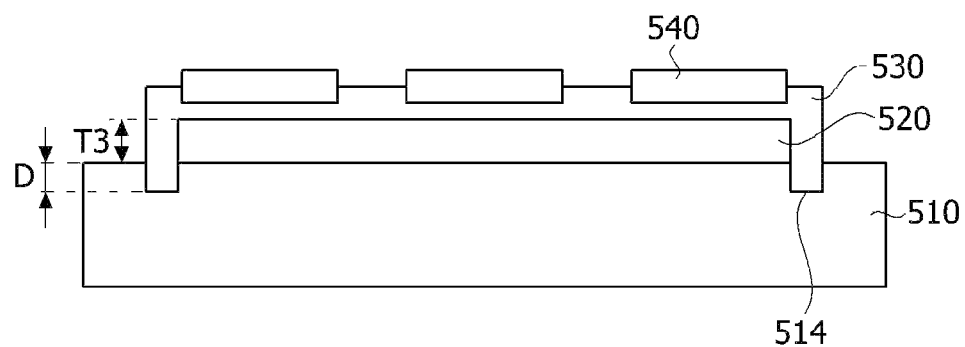
FIG. 8 is a cross-sectional view illustrating a lower substrate of a thermoelectric module according to yet another embodiment of the present invention.
Figure 9:
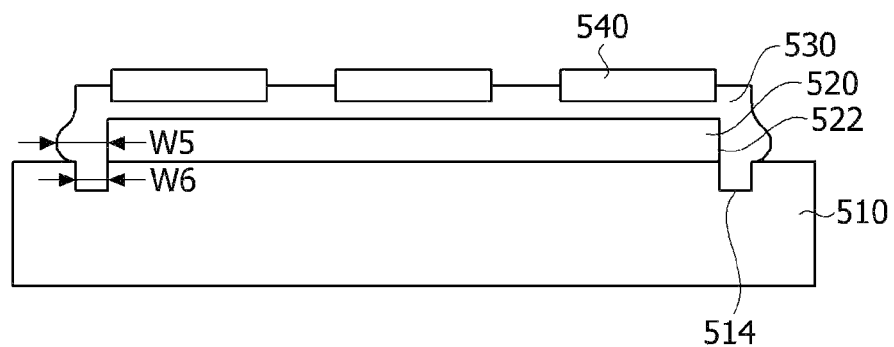
FIG. 9 is a cross-sectional view illustrating a lower substrate of a thermoelectric module according to yet another embodiment of the present invention.

FIG. 5 is a cross-sectional view illustrating a lower substrate of a thermoelectric module according to one embodiment of the present invention, FIG. 6 is a cross-sectional view illustrating a lower substrate of a thermoelectric module according to another embodiment of the present invention, FIG. 7 is a cross-sectional view illustrating a lower substrate of a thermoelectric module according to still another embodiment of the present invention, FIG. 8 is a cross-sectional view illustrating a lower substrate of a thermoelectric module according to yet another embodiment of the present invention, and FIG. 9 is a cross-sectional view illustrating a lower substrate of a thermoelectric module according to yet another embodiment of the present invention.

Referring to FIG. 5, a lower substrate of the thermoelectric module 500 according to one embodiment of the present invention includes a metal support 510, a first heat conductive layer 520 disposed on the metal support 510, a second heat conductive layer 530 disposed on the first heat conductive layer 520, and a plurality of first electrodes 540 disposed on the second heat conductive layer 530. As shown in FIGS. 1 and 2, a pair of P-type thermoelectric leg and N-type thermoelectric leg are disposed on each electrode 540, a structure in which an upper electrode and an upper substrate are symmetrical to a lower electrode and a lower substrate may be formed with a plurality of P-type thermoelectric legs and a plurality of N-type thermoelectric legs interposed therebetween. For example, a plurality of second electrodes (not shown) symmetrical to the plurality of first electrodes 540, a fourth heat conductive layer (not shown) symmetrical to the second heat conductive layer 530, and a third heat conductive layer (not shown) symmetrical to the first heat conductive layer 520 may be further disposed on the plurality of P-type thermoelectric legs and the plurality of N-type thermoelectric legs. The first heat conductive layer 520, the second heat conductive layer 530, the plurality of first electrodes 540, the plurality of P-type thermoelectric legs and the plurality of N-type thermoelectric legs, the plurality of second electrodes (not shown), the second heat conductive layer (not shown) symmetrical with the second heat conductive layer 530, and the third heat conductive layer (not shown) symmetrical to the first heat conductive layer 520 may be included in the thermoelectric element 100.

Hereinafter, for convenience of description, the metal support 510, the first heat conductive layer 520, the second heat conductive layer 530, and the plurality of first electrodes 540, which are disposed below the plurality of P-type thermoelectric legs and the plurality of N-type thermoelectric legs, will be mainly described. However, a structure that is equal to the above structure may be symmetrically disposed on the plurality of P-type thermoelectric legs and the plurality of N-type thermoelectric legs. That is, the upper substrate may also be formed with a structure that is equal to the above structure.

The metal support 510 may be made of Al, an Al alloy, Cu, a Cu alloy, or the like. The metal support 510 may support the first heat conductive layer 520, the second heat conductive layer 530, the plurality of first electrodes 540, the plurality of P-type thermoelectric legs, and the plurality of N-type thermoelectric legs and may be an area which is directly bonded to an application to which the thermoelectric element 500 according to the embodiment of the present invention is applied. To this end, a width of the metal support 510 may be greater than that of the first heat conductive layer 520, and a thickness of the metal support 510 may be greater than that of the first heat conductive layer 520.

The first heat conductive layer 520 is disposed on the metal support 510 and made of a resin composition containing an epoxy resin and an inorganic filler. A thickness T3 of the first heat conductive layer 520 may range from 0.01 to 0.65 mm, preferably 0.01 to 0.6 mm, and more preferably 0.01 to 0.55 mm, and thermal conductivity of the first heat conductive layer 520 may be 10 W/mK or more, preferably 20 W/mK or more, and more preferably 30 W/mK or more.

To this end, the epoxy resin may include an epoxy compound and a curing agent. In this case, the curing agent may be included in a volume ratio of 1 to 10 relative to a volume ratio of 10 of the epoxy compound. Here, the epoxy compound may include at least one among a crystalline epoxy compound, an amorphous epoxy compound, and a silicone epoxy compound. The crystalline epoxy compound may include a mesogen structure. Mesogen is a basic unit of a liquid crystal and includes a rigid structure. In addition, the amorphous epoxy compound may be a conventional amorphous epoxy compound having two or more epoxy groups in a molecule. For example, the amorphous epoxy compound may be glycidyl ethers derived from bisphenol A or bisphenol F. Here, the curing agent may include at least one among an amine-based curing agent, a phenol-based curing agent, an acid anhydride-based curing agent, a polymercaptan-based curing agent, a polyaminoamide-based curing agent, an isocyanate-based curing agent, and a block isocyanate-based curing agent, and alternatively, two or more kinds of curing agents may be mixed to be used as the curing agent.

The inorganic filler may include a boron nitride agglomerate in which Al2O3 and a plurality of plate-like boron nitrides are agglomerated. The inorganic filler may further include aluminum nitride. Here, a surface of the boron nitride agglomerate may be coated with a polymer having the following monomer 1, or at least a part of voids in the boron nitride agglomerate may be filled with the polymer having the following monomer The monomer 1 is as follows.

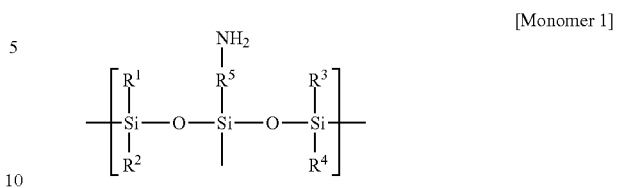

[Monomer 1]

Here, one among R1, R2, R3, and R4 may be H, the remainder thereamong may be selected from the group consisting of C1 to C3 alkyl, C2 to C3 alkene, and C2 to C3 alkyne, and R5 may be a divalent organic linker having a linear, branch, or cyclic shape and a carbon number of 1 to 12.

As one example, one of the remainder among R1, R2, R3, and R4 excluding H may be selected from C2 to C3 alkene, and another one and still another one of the remainder thereamong may be selected from C1 to C3 alkyl. For example, the polymer according to the embodiment of the present invention may include the following monomer 2.

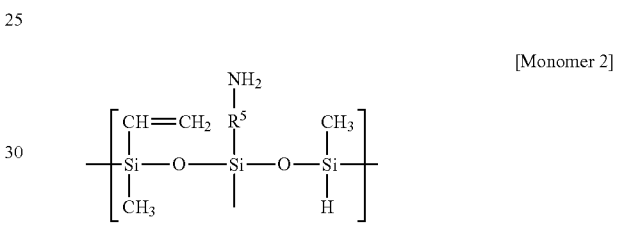

[Monomer 2]

Alternatively, the remainder among R1, R2, R3, and R4 excluding H may be differently selected from the group consisting of C1 to C3 alkyl, C2 to C3 alkene, and C2 to C3 alkyne.

As described above, when the polymer according to the monomer 1 or the monomer 2 is applied on the boron nitride agglomerate in which the plate-like boron nitride is agglomerated and at least a part of the voids in the boron nitride agglomerate are filled with the polymer, an air layer in the boron nitride agglomerates may be minimized to increase thermal conductivity performance of the boron nitride agglomerate, and it is possible to prevent a breakage of the boron nitride agglomerate by increasing a bonding force between the plate-shaped boron nitrides. In addition, when a coating layer is formed on the boron nitride agglomerate in which the plate-like boron nitride is agglomerated, it is easy to form a functional group, and, when the functional group is formed on the coating layer of the boron nitride agglomerate, affinity with a resin may be increased.

In this case, the metal support 510 and the first heat conductive layer 520 may be directly bonded without an additional adhesive. To this end, when a resin composition that is equal to the resin composition constituting the first heat conductive layer 520 is applied on the metal support 510 in an uncured state and the first heat conductive layer 520, which is in the cured state, is stacked on the applied resin composition and then pressurized at a high temperature, the metal support 510 and the first heat conductive layer 520 may be directly bonded.

Meanwhile, the second heat conductive layer 530 may be made of a resin composition including a silicone resin and an inorganic filler. The second heat conductive layer 530 may be disposed between the first heat conductive layer 520 and the plurality of first electrodes 540 and may serve to bond the first heat conductive layer 520 to the plurality of first electrodes 540. For example, the silicone resin included in the resin composition constituting the second heat conductive layer 530 may be polydimethylsiloxane (PDMS), and the inorganic filler included in the resin composition constituting the second heat conductive layer 530 may be Al2O3. The resin composition may have high thermal conductivity performance as well as high tensile strength, a high thermal expansion coefficient, and high bonding performance. Even when the resin composition is cured, the resin composition may have a flexible property. For example, the resin composition may have thermal conductivity performance of 1.8 W/mK or more and a linear thermal expansion coefficient of 125 ppm/° C. or more. In addition, the second heat conductive layer 530 may have a characteristic in which thermal conductivity is lower than that of the first heat conductive layer 520. Thus, the first heat conductive layer 520 and the plurality of electrodes 540 may be stably bonded without degradation in thermal conductivity performance. In this case, a thickness T4 of the second heat conductive layer 530 may be 0.001 to 1 times, preferably 0.01 to 0.5 times, and more preferably 0.05 to 0.2 times the thickness T3 of the first heat conductive layer 520. When the thickness of the second heat conductive layer 530 is formed in the above numerical range, a bonding force between the first heat conductive layer 520 and the plurality of first electrodes 540 may be maintained without degradation in thermal conductivity performance of the first heat conductive layer 520.

To this end, when the resin composition constituting the second heat conductive layer 530 is applied on the first heat conductive layer 520 in an uncured state and the plurality of first electrodes 540 are stacked on the applied resin composition and then pressurized, the plurality of first electrodes 540 and the first heat conductive layer 520 may be bonded through the second heat conductive layer 530. Accordingly, at least a part of a side surface 542 of each of the plurality of electrodes 540 may be embedded in the second heat conductive layer 530. For example, a thickness H which is 0.1 to 0.9 times, preferably 0.2 to 0.8 times, and more preferably 0.3 to 0.7 times a thickness H of the side surface 542 of each of the plurality of electrodes 540 may be embedded in the second heat conductive layer 530. When the thickness H1 of the side surface 542 of each of the plurality of electrodes 540 embedded in the second heat conductive layer 530 is less than 0.1 times the thickness H of the side surface 542 of each of the plurality of first electrodes 540, there is a probability that at least some of the plurality of first electrodes 540 are separated from the second heat conductive layer 530. When the thickness H1 of the side surface 542 of each of the plurality of electrodes 540 embedded in the second heat conductive layer 530 exceeds 0.9 times the thickness H of the side surface 542 of each of the plurality of first electrodes 540, the resin composition constituting the second heat conductive layer 530 may flow on at least some of the plurality of first electrodes 540 to weaken the bonding force between the first electrodes 540 and the P-type thermoelectric leg and the bonding force between the first electrodes 540 and the N-type thermoelectric leg.

Meanwhile, the second heat conductive layer 530 may be disposed to surround a top surface 524 of the first heat conductive layer 520 as well as a side surface 522 thereof and may be disposed on a top surface 512 of the metal support 510 in contact with the side surface 522 of first heat conductive layer 520. When the second heat conductive layer 530 is disposed on the top surface 524 of the first heat conductive layer 520, the side surface 522 of the first heat conductive layer 520, and the top surface 512 of the metal support 510 in contact with the side surface 522 of the first heat conductive layer 520, the bonding force between the metal support 510 and the first heat conductive layer 520 at an edge of the first heat conductive layer 520 may be increased, and it is possible to prevent a problem of delamination of the edge of the first heat conductive layer 520, due to a variation in temperature, from the metal support 510.

In addition, since the second heat conductive layer 530 has a high thermal expansion coefficient and a flexible property even when cured, the second heat conductive layer 530 may serve as a buffer against a thermal shock due to a variation in temperature, thereby protecting the first heat conductive layer 510 and the plurality of first electrodes 540.

As described above, in order to arrange the second heat conductive layer 530 to surround the top surface 524 of the first heat conductive layer 520 as well as the side surface 522 thereof, a width W2 of the second heat conductive layer 530 may be larger than a width W1 of first heat conductive layer 520. For example, the width W2 of the second heat conductive layer 530 may be 1.01 to 1.2 times the width W1 of the first heat conductive layer 520. When the width W2 of the second heat conductive layer 530 is greater than the width W1 of the first heat conductive layer 520, the bonding force between the first heat conductive layer 520 and the metal support 510 may be enhanced, and the thermal shock between the first heat conductive layer 520 and the plurality of electrodes 540 may be decreased.

Meanwhile, as shown in FIG. 6, the second heat conductive layer 530 may further extend on the metal support 510 in a direction parallel to the top surface 512 of the metal support 510. An extended width W3 may be 0.001 to 0.2 times, and preferably 0.01 to 0.1 times the width W2 of the second heat conductive layer 530 having the structure shown in FIG. 5. As described above, when the second heat conductive layer 530 further extends on the metal support 510 in the direction parallel to the top surface 512 of the metal support 510, a contact area between the second heat conductive layer 530 and the metal support 510 is increased so that it is possible to prevent a problem of delamination of the edge of the first heat conductive layer 520 from the metal support 510.

Alternatively, as shown in FIG. 7, the second heat conductive layer 530 may be disposed in a shape spreading to a side from the side surface 522 of the first heat conductive layer 520. That is, the thickness T4 of the second heat conductive layer 530 may be formed to be thickest at the side surface 522 of the first heat conductive layer 520 and may become thinner in a direction away from the side surface 522 of the first heat conductive layer 520. As described above, when a width W4 of the second heat conductive layer 530 is disposed to be increased, the contact area between the second heat conductive layer 530 and the metal support 510 is increased so that it is possible to solve a problem of delamination of the first heat conductive layer 520 and the metal support 510.

Alternatively, as shown in FIG. 8, a groove 514 may be formed in the metal support 510, and the second heat conductive layer 530 may be further disposed in the groove 514 of the metal support 510. The groove 514 may be formed along the edge of the first heat conductive layer 520, a depth D of the groove 514 may be formed 0.001 to 2 times, preferably 0.01 to 1 times, and more preferably 0.1 to 1 times the thickness T3 of the first heat conductive layer 520. As described above, when the groove 514 is formed in the metal support 510 and the second heat conductive layer 530 is further disposed in the groove 514, the contact area between the second heat conductive layer 530 and the metal support 510 is increased so that it is possible to prevent the problem of delamination of the edge of the first heat conductive layer 520 from the metal support 510. In this case, the groove 514 may be formed on the top surface of the metal support 510 in a continuous shape along the edge of the first heat conductive layer 520. Alternatively, a plurality of grooves 514 may be formed on the top surface of the metal support 510 in the form of a dashed line to be spaced at predetermined intervals along the edge of the first heat conductive layer 520.

Alternatively, as shown in FIG. 9, a width W5 of the second heat conductive layer 530 disposed on the side surface 522 of the first heat conductive layer 520 may be greater than a width W6 of the groove 514 of the metal support 510. That is, the width W6 of the second heat conductive layer 530 disposed in the groove 514 may be smaller than the width W5 of the second heat conductive layer 530 disposed on the side surface 522 of the first heat conductive layer 520. As described above, when a width W5 of the second heat conductive layer 530 is disposed to be increased, the contact area between the second heat conductive layer 530 and the metal support 510 is increased so that it is possible to solve the problem of delamination of the edge of the first heat conductive layer 520 from the metal support 510. Alternatively, as not shown in the drawings, the width W5 of the second heat conductive layer 530 disposed on the side surface 522 of the first heat conductive layer 520 may be greater than the width W6 of the groove 514 of the metal support 510 and may be disposed to be in contact with the top surface 512 of the metal support 510.

Figure 10:
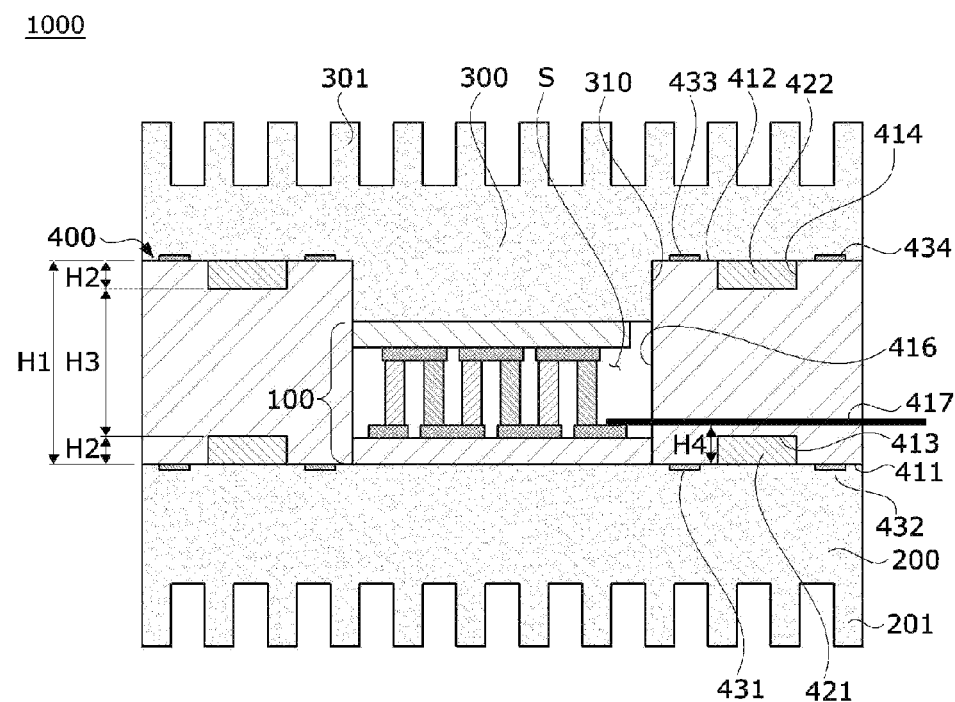
FIG. 10 is a cross-sectional view illustrating a thermoelectric module according to another embodiment of the present invention.
Figure 11:
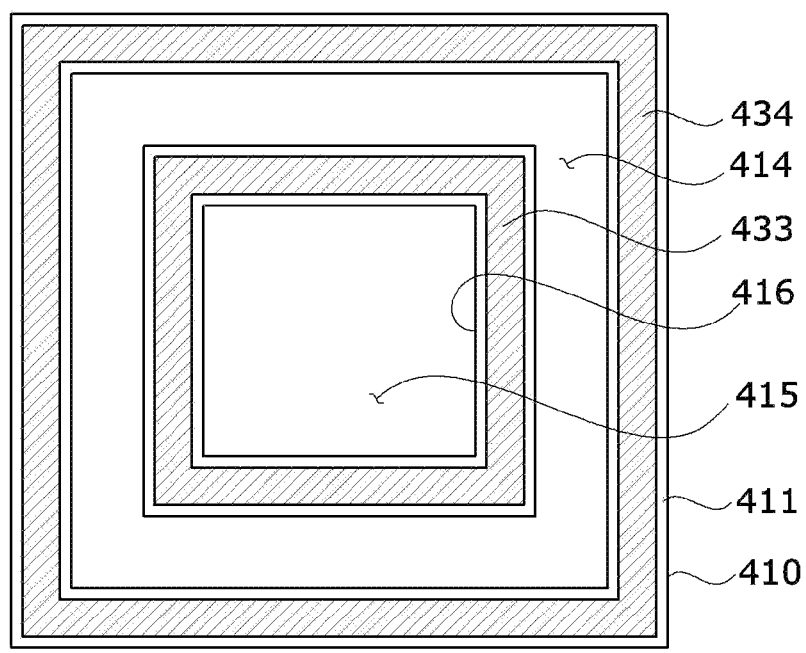
FIG. 11 is a top view illustrating a sealing part of FIG. 10.

FIG. 10 is a cross-sectional view illustrating a thermoelectric module according to another embodiment of the present invention. FIG. 11 is a top view illustrating a sealing part of FIG. 10, and FIG. 12 is a perspective view illustrating a body of FIG. 10.

Hereinafter, a thermoelectric module 1000 according to the embodiment of the present invention will be described with reference to FIGS. 10 to 12.

Figure 12:
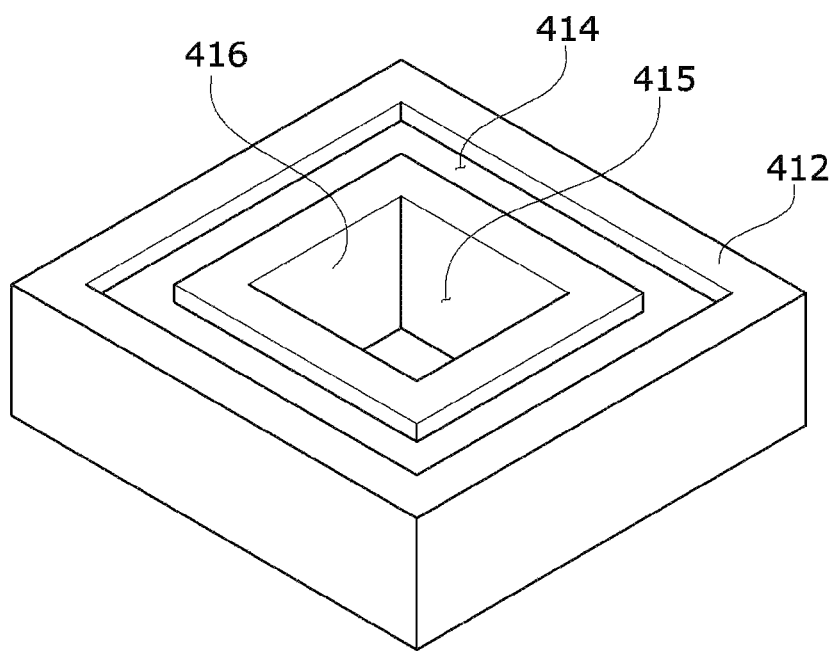
FIG. 12 is a perspective view illustrating a body of FIG. 10.

Referring to FIGS. 10 to 12, the thermoelectric module 1000 may include a thermoelectric element 100, a first heat conductive plate 200, a second heat conductive plate 300, and a sealing part 400.

Here, the thermoelectric element 100 may be the thermoelectric element described with reference to FIGS. 1 to 9, and at least one among a lower substrate, a lower electrode, an upper substrate, and an upper electrode of the thermoelectric element 100 may have the structure of the embodiment described with reference to FIGS. 5 to 9. The first heat conductive plate 200 may be the metal support 200 described with reference to FIGS. 3 and 4 or the metal support 510 described with reference to FIGS. 5 to 9, and the same description as that of the first heat conductive plate 200 may be applied to the second heat conductive plate 300.

According to the embodiment of the present invention, the first heat conductive plate 200 and the second heat conductive plate 300 are opposite to each other with the thermoelectric element 100 interposed therebetween. The first heat conductive plate 200 and the second heat conductive plate 300 may each be made of a metal material having excellent thermal conductivity.

Here, the first heat conductive plate 200 is installed between a heat absorption surface and a surface of a cooling side (not shown) of the thermoelectric element 100 to increase a heat transfer area when heat is absorbed through the heat absorption surface of the thermoelectric element 100. In this case, Al is used as the first heat conductive plate 200, and alternatively, Cu, stainless steel, or brass may be used as the first heat conductive plate 200.

In order to increase the heat transfer area when the first heat conductive plate 200 is used, the first heat conductive plate 200 may reduce a temperature gradient by including a plurality of heat radiation fins 201. Most of all, a gap between the cooling side (not shown) and the second heat conductive plate 300 bonded in a direction of a heat radiation surface of the thermoelectric element 100 is intentionally maintained so that it is possible to block heat from being transferred from the relatively hot second heat conductive plate 300 to the cold cooling side (not shown).

The second heat conductive plate 300 is pressed against the heat radiation surface of the thermoelectric element 100 to radiate heat from the thermoelectric element 100. Generally, an extruded-type heat radiation plate is commonly used as the second heat conductive plate 300. In some cases, a skiving type heat radiation plate, a heat pipe embedded type heat radiation plate, or a fin-bonded type heat radiation plate may be used as the second heat conductive plate 300.

In order to increase the heat transfer area, the second heat conductive plate 300 may include a plurality of heat radiation fins 301 and a step 310 for arranging the sealing part 400 in a corner area.

Here, although it has been described that the first heat conductive plate 200 is set as the heat absorption surface and the second heat conductive plate 300 is set as the heat radiation surface, the heat absorption surface and the heat radiation surface may be interchanged according to a direction of a current applied to the thermoelectric element.

The sealing part 400 may include a body 410 and sealing members 421, 422, 431, 432, 433, and 434.

The body 410 may have a first height H1 and a substantial hexahedral shape having a bottom surface 411, a top surface 412, and side surfaces. Alternatively, the body 410 may have a cylindrical shape having the bottom surface 411, the top surface 412, and an outer circumferential surface.

The body 410 may be made of expanded polystyrene (EPS).

The EPS is lightweight and has excellent formability, excellent heat resistance and heat insulation, density controllability, and excellent waterproof and dust-proof performance so that the EPS may provide excellent effects in terms of economy and product reliability.

The bottom surface 411 of the body 410 may include a first groove 413 concavely formed from the bottom surface 411 at a second depth H2.

In addition, the top surface 413 of the body 410 may include a second groove 414 concavely formed from the top surface 413 at a second depth H2.

A bottom surface of the first groove 413 may be spaced a third height H3 from a bottom surface of the second groove 414.

Here, the first height H1 may be set three to five times the second height H2. Here, the third height H3 may be set one to three times the second height H2.

When the first height H1 of the body 410 is less than three times the second heights H2 of the first groove 413 and the second groove 414, the third height H3 which is a distance between the first groove 413 and the second groove 414 becomes relatively smaller so that it is difficult to secure structural rigidity of the body 410. When the first height H1 of the body 410 exceeds 5 times the second heights H2 of the first groove 413 and the second grooves 414, a path of moisture which may be introduced along inner surfaces of the first grooves 413 and the second grooves 414 is shortened so that there is a problem in that it is difficult to secure reliability for waterproof and dust-proof performance or a volume of the thermoelectric module 1000 is increased.

Each of the first groove 413 and the second groove 414 has a square shape or a circular shape with a closed circumference.

The body 410 may include a hole 415 formed at an approximate center thereof to pass through the bottom surface 411 and the top surface 412.

The hole 415 forms an accommodation space for accommodating the thermoelectric element 100, and the thermoelectric element 100 may be accommodated in the accommodation space of the hole 415.

Meanwhile, the accommodation space may be formed in the range of 1.1 to five times a volume of the thermoelectric element 100. More preferably, the accommodation space may be implemented in the range of two to three times the volume of the thermoelectric element 100.

When the accommodation space is less than or equal to 1.1 times the volume of the thermoelectric element 100, since a heat flow space is not secured in a side surface of the thermoelectric element 100, heat flow performance is not expected to improve. When the accommodation space is greater than or equal to five times the volume of the thermoelectric element 100, there is a problem of increasing the volume of the thermoelectric module 1000 without expecting improvement in the heat flow performance due to expansion of the accommodation space S.

That is, the thermoelectric module 1000 according to one embodiment of the present invention may expand heat flow, which is generated due to a difference in temperature between the lower substrate and the upper substrate of the thermoelectric element 100, to a side portion of the thermoelectric element 100 so that reliability due to the heat flow may be secured.

Here, an inner side surface 416 of the hole 415 of the body 410 is in contact with the side surface of the thermoelectric element 100 so that movement of the thermoelectric element 100 may be prevented.

That is, a shape and a diameter of the hole 415 of the body 410 may be easily designed and changed according to the shape of the thermoelectric element 100.

In addition, one side surface of the body 410 may include a through-hole 417 through which the lead lines 181 and 182 of the thermoelectric element 100 are drawn out to the outside.

Meanwhile, the through-hole 417 may have a fourth height H4 from the bottom surface 411 of the body 410, and the fourth height H4 may be larger than the second height H2 of the first groove 413.

The sealing members 421, 422, 431, 432, 433, and 434 may include a first sealing member 421, a second sealing member 422, a third sealing member 431, a fourth sealing member 432, a fifth sealing member 433, and a sixth sealing member 434.

The first sealing member 421 is disposed to be inserted into the first groove 413 in the bottom surface 411 of the body 410 and seals to prevent moisture from infiltrating into the body 410.

Here, it is preferable that the first sealing member 421 is implemented as waterproof silicone or the like which is introduced into the first groove 413 before being cured to be capable of bonding the first groove 413 to the first heat conductive plate 200.

The second sealing member 422 is disposed to be inserted into the first groove 414 in the top surface 412 of the body 410 and seals to prevent moisture from infiltrating into the body 410.

Here, it is preferable that the second sealing member 422 is implemented as waterproof silicone or the like which is introduced into the second groove 414 before being cured to be capable of bonding the second groove 414 to the second heat conductive plate 300.

Each of the third sealing member 431, the fourth sealing member 432, the fifth sealing member 433 and the sixth sealing member 434 may be made of waterproof tape, waterproof silicone, or an adhesive made of a rubber or resin material, thereby bonding the body 410 to the first heat conductive plate 200 and the second heat conductive plate 300.

That is, it is possible to improve the bonding force and sealability between the first heat conductive plate 200, the second heat conductive plate 300, and the body 410 through the third sealing member 431, the fourth sealing member 432, the fifth sealing member 433, and the sixth sealing member 434.

Meanwhile, the third sealing member 431 and the fourth sealing member 432 may be disposed between the bottom surface 411 of the body 410 and the first heat conductive plate 200, and the fifth sealing member 433 and the sixth sealing member 434 may be disposed between the top surface 412 of the body 410 and the second heat conductive plate 300.

The third sealing member 431 may be disposed between the first groove 413 and the hole 415 on the bottom surface 411 of the body 410 and may have a square shape or a circular shape with a closed circumference.

The fourth sealing member 432 may be disposed between the first groove 413 and an outer surface thereof on the bottom surface 411 of the body 410 and may have a square shape or a circular shape with a closed circumference.

The fifth sealing member 433 may be disposed between the second groove 414 and the hole 415 on the top surface 412 of the body 410 and may have a square shape or a circular shape with a closed circumference.

The sixth sealing member 434 may be disposed between the second groove 414 and an outer surface thereof on the top surface 412 of the body 410 and may have a square shape or a circular shape with a closed circumference.

Figure 13:
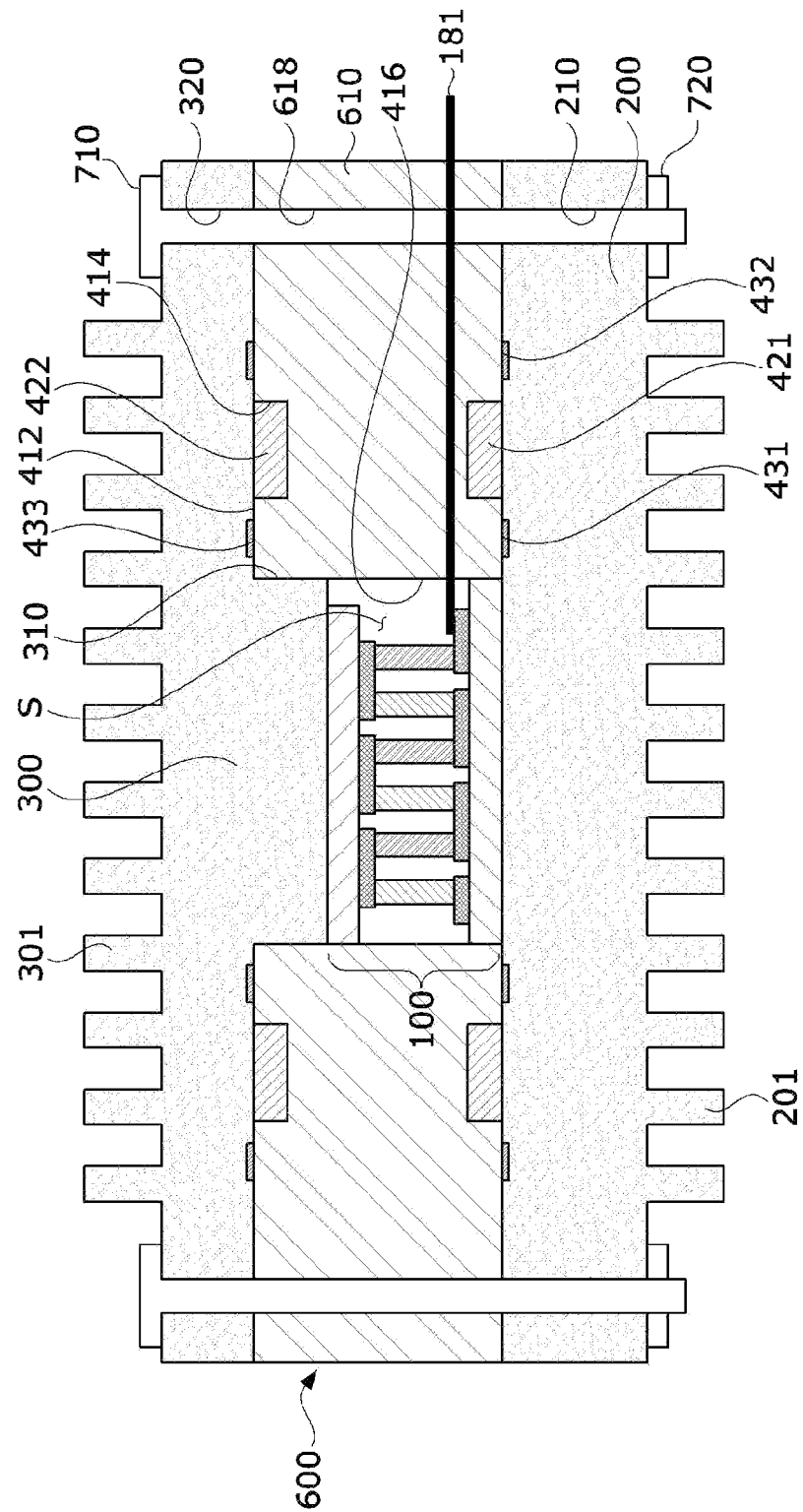
FIG. 13 is a cross-sectional view of a thermoelectric module according to still another embodiment of the present invention.
Figure 14:
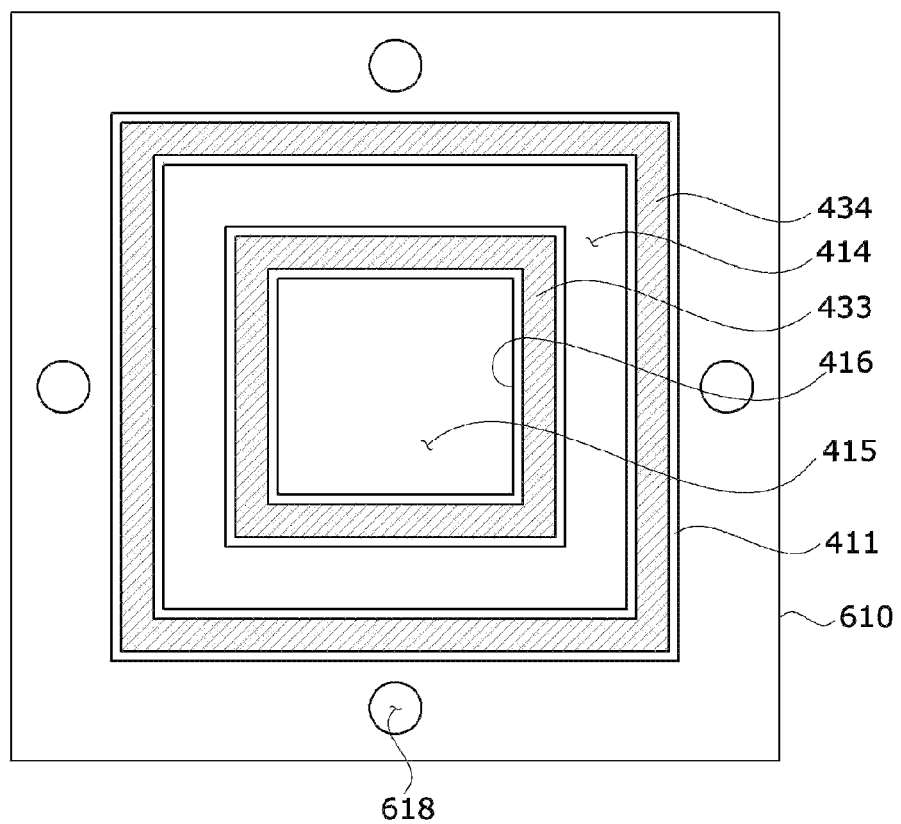
FIG. 14 is a top view illustrating a sealing part of a thermoelectric module according to still another embodiment of the present invention.

FIG. 13 is a cross-sectional view of a thermoelectric module according to still another embodiment of the present invention, and FIG. 14 is a top view illustrating a sealing part of a thermoelectric module according to still another embodiment of the present invention.

As compared with the thermoelectric module 1000 according to one embodiment of the present invention shown in FIG. 10, a thermoelectric module 2000 shown in FIGS. 13 and 14 has a different configuration of a sealing part 600. Thus, hereinafter, only the different configuration of the sealing part 600 will be described in detail, and detailed descriptions of duplicated reference numerals in the same configuration will be omitted herein.

The sealing part 600 may include a body 610 and sealing members 421, 422, 431, 432, 433, and 434.

The body 610 may include an engagement hole 418 passing through the bottom surface 411 and the top surface 412 between the first groove 413 and an outer surface of the body 610.

In addition, the body 610 may include engagement holes 210 and 320 passing through the first heat conductive plate 200 and the second heat conductive plate 300 at a position corresponding to the engagement hole 418.

A first engagement member 710, such as a bolt, may be inserted into the engagement hole 418 of the body 610, the engagement hole 210 of the first heat conductive plate 200, and the engagement hole 320 of the second heat conductive plate 300, and a second engagement member 720, such as a nut, may be engaged at a side opposite to the insertion side.

That is, the first heat conductive plate 200, the body 610, and the second heat conductive plate 300 may be more firmly coupled through the engagement of the first engagement member 710 and the second engagement member 720, and deformation due to heat may be prevented.

Hereinafter, an example in which the thermoelectric element according to an embodiment of the present invention is applied to a water purifier will be described with reference to FIG. 15.

Figure 15:
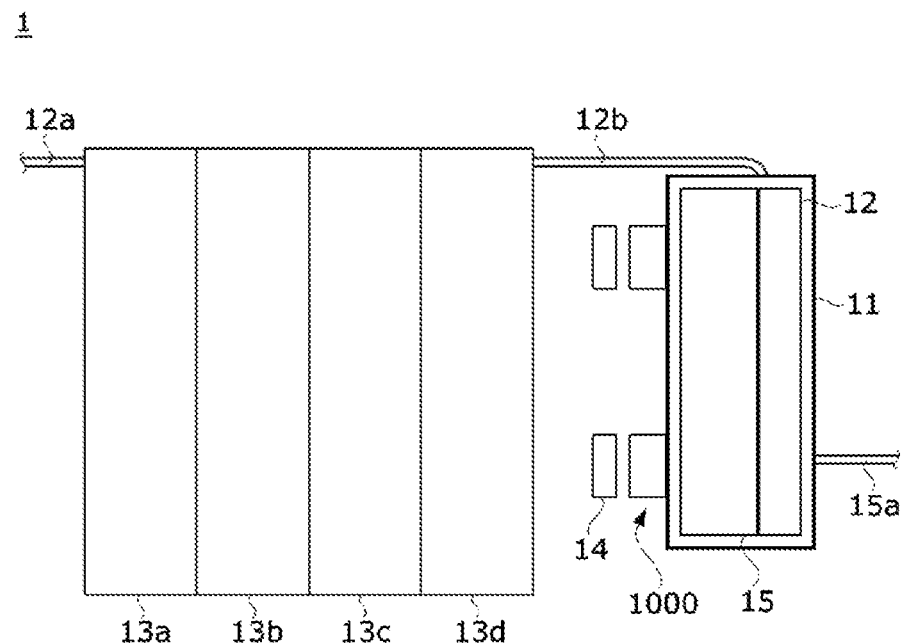
FIG. 15 is a diagram illustrating an example in which the thermoelectric element according to an embodiment of the present invention is applied to a water purifier.

FIG. 15 is a diagram illustrating an example in which the thermoelectric element according to an embodiment of the present invention is applied to a water purifier.

A water purifier 1 to which the thermoelectric element according to the embodiment of the present invention is applied includes a raw water supply pipe 12a, a water purification tank inlet pipe 12b, a water purification tank 12, a filter assembly 13, a cooling fan 14, a heat storage tank 15, a cold water supply pipe 15a, and the thermoelectric module 1000.

The raw water supply pipe 12a is a supply pipe for introducing water, which is a purification target, from a water source into the filter assembly 13, the water purification tank inlet pipe 12b is an inlet pipe for introducing the water, which is purified in the filter assembly 13, into the water purification tank 12, and the cold water supply pipe 15a is a supply pipe for finally supplying cold water, which is cooled at a predetermined temperature due to the thermoelectric module 1000 in the water purification tank 12, to a user.

The water purification tank 12 temporarily stores and supplies the water, which is purified by passing through the filter assembly 13 and is introduced through the water purification tank inlet pipe 12b, to the outside.

The filter assembly 13 includes a precipitation filter 13a, a pre carbon filter 13b, a membrane filter 13c, and a post carbon filter 13d.

That is, the water introduced into the raw water supply pipe 12a may be purified while passing through the filter assembly 13.

The heat storage tank 15 is disposed between the water purification tank 12 and the thermoelectric module 1000 and stores cold air formed in the thermoelectric module 1000. The cold air stored in the heat storage tank 15 is supplied to the water purification tank 12 to cool the water accommodated in the water purification tank 120.

In order to facilitate transfer of the cold air, the heat storage tank 15 may be in surface contact with the water purification tank 12.

As described above, the thermoelectric module 1000 includes the heat absorption surface and the heat radiation surface, and one side of the thermoelectric module 1000 is cooled and the other side thereof is heated due to electron movements in a P-type semiconductor and an N-type semiconductor.

Here, the one side may be a side of the water purification tank 12, and the other side may be a side opposite to the water purification tank 12.

In addition, as described above, the thermoelectric module 1000 has excellent waterproof and dust-proof performance and improved heat flow performance so that the thermoelectric module 1000 may efficiently cool the water purification tank 12 in the water purifier.

Hereinafter, an example in which the thermoelectric element according to an embodiment of the present invention is applied to a refrigerator will be described with reference to FIG. 16.

Figure 16:
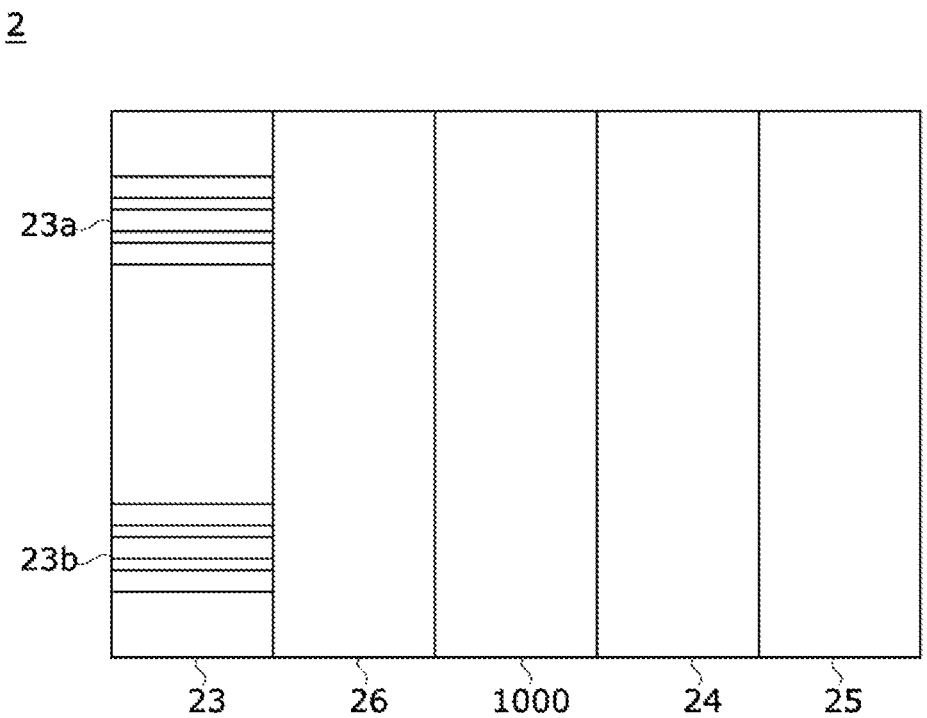
FIG. 16 is a diagram illustrating an example in which the thermoelectric element according to the embodiment of the present invention is applied to a refrigerator.

FIG. 16 is a diagram illustrating an example in which the thermoelectric element according to the embodiment of the present invention is applied to a refrigerator.

The refrigerator includes a deep temperature evaporation chamber cover 23, an evaporation chamber partition wall 24, a main evaporator 25, a cooling fan 26, and a thermoelectric module 1000 in a deep temperature evaporation chamber.

An interior of the refrigerator is divided into a deep temperature storage chamber and the deep temperature evaporation chamber by the deep temperature evaporation chamber cover 23.

Specifically, an inner space corresponding to a front side of the deep temperature evaporation chamber cover 23 may be defined as the deep temperature storage chamber, and an inner space corresponding to a rear side of the deep temperature evaporation chamber cover 23 may be defined as the deep temperature evaporation chamber.

A discharge grille 23a and a suction grille 23b may be formed on a front surface of the deep temperature evaporation chamber cover 23.

The evaporation chamber partition wall 24 is installed at a position separated from a rear wall of an inner cabinet to the front side, thereby partitioning a space in which a deep temperature storage system is provided from a space in which the main evaporator 25 is provided.

Cold air cooled by the main evaporator 25 is supplied to a freezing compartment and then returned to the main evaporator.

The thermoelectric module 1000 is accommodated in the deep temperature evaporation chamber and has a structure in which the heat absorption surface faces a drawer assembly and the heat radiation surface faces an evaporator. Thus, a heat absorption phenomenon generated due to the thermoelectric module 1000 may be utilized to rapidly cool food stored in the drawer assembly at an ultra-low temperature that is less than or equal to 50 degrees Celsius.

In addition, as described above, the thermoelectric module 1000 has excellent waterproof and dust-proof performance and improved heat flow performance so that the thermoelectric module 1000 may efficiently cool the drawer assembly in the refrigerator.

The thermoelectric element according to the embodiment of the present invention may be applied to a power generation device, a cooling device, and a heating device. Specifically, the thermoelectric element according to the embodiment of the present invention may be mainly applied to optical communication modules, sensors, medical devices, measurement devices, the aerospace industry, refrigerators, chillers, vehicle ventilation seats, cup holders, washing machines, dryers, wine cellars, water purifiers, power supplies for sensors, thermopiles, and the like.

Here, an example in which the thermoelectric element according to the embodiment of the present invention is applied to a medical device includes a polymerase chain reaction (PCR) device. The PCR device is a device for amplifying deoxyribonucleic acid (DNA) to determine a DNA base sequence and requires accurate temperature control and a thermal cycle. To this end, a Peltier-based thermoelectric element may be applied.

Another example in which the thermoelectric element according to the embodiment of the present invention is applied to a medical device includes a photo detector. Here, the photo detector includes an infrared/ultraviolet detector, a charge coupled device (CCD) sensor, an X-ray detector, and a thermoelectric thermal reference source (TTRS). The Peltier-based thermoelectric element may be applied so as to cool the photo detector. Accordingly, it is possible to prevent a variation in wavelength, a decrease in output, and degradation in resolution due to an increase in temperature in the photo detector.

Still other examples in which the thermoelectric element according to the embodiment of the present invention is applied to medical devices include an immunoassay field, an in vitro diagnostics field, general temperature control and cooling systems, a physical therapy field, a liquid chiller system, and a blood/plasma temperature control field. Accordingly, accurate temperature control is possible.

As another example in which the thermoelectric element according to the embodiment of the present invention is applied to a medical device, there is an artificial heart. Accordingly, power may be supplied to the artificial heart.

Examples of the thermoelectric element according to the embodiment of the present invention applied to the aerospace industry include a star tracking system, a thermal imaging camera, an infrared/ultraviolet detector, a CCD sensor, the Hubble space telescope, and a TTRS. Accordingly, it is possible to maintain a temperature of an image sensor.

Other examples in which the thermoelectric element according to the embodiment of the present invention is applied to the aerospace industry include a cooling device, a heater, and a power generation device.

In addition to the above description, the thermoelectric element according to the embodiment of the present invention may be applied to power generation, cooling, and heating in other industrial fields.

Although the description has been made with reference to the exemplary embodiments of the present invention, it should be understood that various alternations and modifications of the present invention can be devised by those skilled in the art to which the present invention pertains without departing from the spirit and scope of the present invention, which are defined by the appended claims.

Technical Problem

The present invention is directed to providing a substrate and an electrode structure of a thermoelectric element.

The present invention is also directed to providing a sealing structure of a thermoelectric module.

Technical Solution

One aspect of the present invention provides a thermoelectric module including a first metal support, a first heat conductive layer disposed on the first metal support and made of a resin composition containing an epoxy resin and an inorganic filler, a second heat conductive layer disposed on the first heat conductive layer and made of a resin composition containing a silicone resin and an inorganic filler, a plurality of first electrodes disposed on the second heat conductive layer, a plurality of P-type thermoelectric legs and a plurality of N-type thermoelectric legs which are alternately disposed on the plurality of first electrodes, a plurality of second electrodes disposed on the plurality of P-type thermoelectric legs and the plurality of N-type thermoelectric legs, a third heat conductive layer disposed on the plurality of second electrodes and made of a resin composition that is equal to the resin composition forming the first heat conductive layer, and a second metal support disposed on the third heat conductive layer, wherein the second heat conductive layer is disposed to surround a top surface and a side surface of the first heat conductive layer.

A width of the first metal support may be greater than a width of the first heat conductive layer, and a second heat conductive layer may be further disposed on the side surface of the first heat conductive layer and disposed on at least a portion of a top surface of the first metal support.

The thermoelectric module may further include a fourth heat conductive layer disposed between the plurality of second electrodes and the third heat conductive layer and made of a resin composition that is equal to the resin composition forming the second heat conductive layer, and the fourth heat conductive layer may be disposed to surround a top surface and side surfaces of the third heat conductive layer.

A width of the second heat conductive layer may be 1.01 to 1.2 times the width of the first heat conductive layer.

The second heat conductive layer may bond the first heat conductive layer to the plurality of first electrodes.

The second heat conductive layer may further bond the first heat conductive layer to the first metal support.

At least a part of side surfaces of the plurality of first electrodes may be embedded in the second heat conductive layer.

A thickness that is 0.1 to 0.9 times a thickness of each of the side surfaces of the plurality of first electrodes is embedded in the second heat conductive layer.

An inorganic filler contained in the resin composition forming the first heat conductive layer may include at least one among aluminum oxide, aluminum nitride, and boron nitride.

The boron nitride may be a boron nitride agglomerate in which plate-like boron nitrides are agglomerated.

A silicone resin included in the resin composition constituting the second heat conductive layer may be polydimethylsiloxane (PDMS), and an inorganic filler included in the resin composition constituting the second heat conductive layer may be aluminum oxide.

Another aspect of the present invention provides a thermoelectric module including a first heat conductive plate, a thermoelectric element disposed on the first heat conductive plate, a second heat conductive plate disposed on the thermoelectric element, and a sealing part surrounding the thermoelectric element and disposed between the first heat conductive plate and the second heat conductive plate, wherein the thermoelectric element includes a first substrate, a plurality of thermoelectric legs disposed on the first substrate, a second substrate disposed on the plurality of thermoelectric legs, an electrode including a plurality of first electrodes disposed between the first substrate and the plurality of thermoelectric legs and a plurality of second electrodes disposed between the second substrate and the plurality of thermoelectric legs, and a lead line electrically connected to the electrode, and wherein the sealing part includes a body in which a hole is formed in a central portion thereof so as to accommodate the thermoelectric element, and a sealing member disposed between a bottom surface of the body and the first metal support and between a top surface of the body and the second metal support.

The body may include a first groove formed at a predetermined depth in the bottom surface and formed along a circumference of the hole, and a second groove formed at a predetermined depth in the top surface and formed along the circumference of the hole.

The sealing member may include a first sealing member inserted into the first groove of the body, and a second sealing member inserted into the second groove of the body.

The sealing member may further include a third sealing member disposed between the first groove and the hole on the bottom surface of the body, and a fourth sealing member disposed between the first groove and an outer corner of the body on the bottom surface of the body.

Each of the third sealing member and the fourth sealing member may have a shape with a closed circumference.

The sealing member may further include a fifth sealing member disposed between the second groove and the hole on the top surface of the body, and a sixth sealing member disposed between the second groove and the outer corner of the body on the top surface of the body.

Each of the fifth sealing member and the sixth sealing member may have a shape with a closed circumference.

The first substrate may be disposed on the first heat conductive plate and may include a first heat conductive layer made of a resin composition containing an epoxy resin and an inorganic filler and a second heat conductive layer disposed on the first heat conductive layer and made of a resin composition containing a silicone resin and an inorganic filler.

The body may include a through-hole through which a first lead wire and a second lead wire pass.

A height of the body may be three to five times a depth of the first groove.

A shortest distance between the first groove and the second groove may be one to three times the depth of the first groove.

The depth of the first groove may be smaller than a shortest distance from the bottom surface of the body to the through-hole.

The body may be expanded polystyrene (EPS).

Each of the first heat conductive plate, the body, and the second heat conductive plate may include an engagement hole passing through from top to bottom, and an engagement member inserted into the engagement hole to engage the first heat conductive plate, the body, and the second heat conductive plate may be further included.

Advantageous Effects

In accordance with embodiments of the present invention, a thermoelectric element having excellent thermal conductivity and high reliability can be provided. In particular, the thermoelectric element according to the embodiments of the present invention can be implemented with a thin thickness and can have high resistance to a variation in temperature so that damage or a delamination phenomenon due to the variation in temperature can be minimized.

In accordance with another embodiment of the present invention, a thermoelectric module with excellent waterproof performance and excellent dust-proof performance can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thermoelectric element comprising:
a first metal substrate;
a first resin layer disposed on the first metal substrate;
a second resin layer disposed on the first resin layer;
a first electrode disposed on the second resin layer such that the second resin layer is between the first resin layer and the first electrode;
a semiconductor structure disposed on the first electrode; and
a second metal substrate disposed on the semiconductor structure,
wherein the second resin layer includes a first area between the first electrode and the first resin layer and a second area other than the first area,
wherein a maximum thickness of the second area is larger than a maximum thickness of the first resin layer, and
wherein the second area of the second resin layer includes a section whose thickness becomes thinner as the section extends away from a side surface of the first electrode.

2. The thermoelectric element of claim 1,
wherein a maximum thickness of the first metal substrate is larger than the maximum thickness of the second area.

3. The thermoelectric element of claim 1,
wherein the first resin layer is in direct contact with the first metal substrate,
wherein the second resin layer is in direct contact with the first resin layer, and
wherein the second resin layer is in direct contact with the first electrode.

4. The thermoelectric element of claim 1,
wherein the first resin layer does not contact with the first electrode.

5. The thermoelectric element of claim 1,
wherein an upper surface of the first area is lower than an upper surface of the second area.

6. The thermoelectric element of claim 5,
wherein the first electrode is disposed on the upper surface of the first area.

* * * * *